(12) United States Patent
Kim et al.

(10) Patent No.: US 11,974,036 B2
(45) Date of Patent: Apr. 30, 2024

(54) ELECTRONIC DEVICE INCLUDING FLEXIBLE DISPLAY AND CAMERA

(71) Applicant: Samsung Electronics Co., Ltd., Gyeonggi-do (KR)

(72) Inventors: Manho Kim, Gyeonggi-do (KR); Taeyun Kim, Gyeonggi-do (KR); Kihuk Lee, Gyeonggi-do (KR); Wonjun Jeong, Gyeonggi-do (KR); Hwajoong Jung, Gyeonggi-do (KR); Changhwan Jin, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 125 days.

(21) Appl. No.: 17/592,962

(22) Filed: Feb. 4, 2022

(65) Prior Publication Data

US 2022/0182521 A1 Jun. 9, 2022

Related U.S. Application Data

(63) Continuation of application No. PCT/KR2021/018300, filed on Dec. 3, 2021.

(30) Foreign Application Priority Data

Dec. 4, 2020 (KR) .................. 10-2020-0168176
Mar. 4, 2021 (KR) .................. 10-2021-0028640

(51) Int. Cl.
*H04N 23/57* (2023.01)
*G09G 3/00* (2006.01)
(Continued)

(52) U.S. Cl.
CPC ............. *H04N 23/57* (2023.01); *G09G 3/035* (2020.08); *H04N 23/51* (2023.01); *H04N 23/54* (2023.01);
(Continued)

(58) Field of Classification Search
CPC ........ H04N 23/57; H04N 23/51; H04N 23/54; H04N 23/65; G09G 3/035;
(Continued)

(56) References Cited

U.S. PATENT DOCUMENTS 7,209,086 B2    4/2007   Chung
8,520,395 B2    8/2013   Rannikko et al.
(Continued)

FOREIGN PATENT DOCUMENTS

EP         3 745 685       12/2020
KR   1020070112636    11/2007
(Continued)

OTHER PUBLICATIONS

International Search Report dated Mar. 3, 2022 issued in counterpart application No. PCT/KR2021/018300, 13 pages.
(Continued)

*Primary Examiner* — Twyler L Haskins
*Assistant Examiner* — Angel L Garces-Rivera
(74) *Attorney, Agent, or Firm* — The Farrell Law Firm, P.C.

(57) ABSTRACT

An electronic device is provided that includes a first housing, a second housing configured to be slidable from the first housing, and a main printed circuit board (PCB) disposed inside the first housing and including a processor mounted therein. The electronic device also includes a camera module disposed in the second housing, and a display module. The display module includes a display having a first region exposed externally and a second region within an internal space of the first housing, while in a slide-in state of the second housing. The display module also includes a first flexible PCB (FPCB) connected to the main PCB. At least a portion of the first FPCB is movable as the second housing slides out from the first housing. The camera module is
(Continued)

electrically connected to the first FPCB to transmit and receive electrical signals to and from the processor mounted on the main PCB.

20 Claims, 16 Drawing Sheets

(51) Int. Cl.
*H04N 23/51* (2023.01)
*H04N 23/54* (2023.01)
*H04N 23/65* (2023.01)
*H05K 1/02* (2006.01)
*H05K 1/14* (2006.01)

(52) U.S. Cl.
CPC ............. *H04N 23/65* (2023.01); *H05K 1/028* (2013.01); *H05K 1/14* (2013.01); *G09G 2330/021* (2013.01); *H05K 2201/10128* (2013.01)

(58) Field of Classification Search
CPC .... G09G 2330/021; H05K 1/028; H05K 1/14; H05K 2201/10128; H05K 2201/10121; H05K 1/147; G06F 1/16; G09F 9/30; H04M 1/0268; H04M 1/0235; H04M 1/0264; H04M 1/0277
See application file for complete search history.

(56) References Cited

U.S. PATENT DOCUMENTS

| 10,222,833 | B2 | 3/2019 | Kim et al. |
| 10,887,438 | B2 | 1/2021 | Baek et al. |
| 2008/0039159 | A1 | 2/2008 | Joo et al. |
| 2017/0126937 | A1 | 5/2017 | Evans et al. |
| 2021/0135151 | A1 | 5/2021 | Baek et al. |
| 2021/0149460 | A1 | 5/2021 | Hsieh et al. |

FOREIGN PATENT DOCUMENTS

| KR | 1020080017748 | 2/2008 |
| KR | 1020080017861 | 2/2008 |
| KR | 1020190091711 | 8/2019 |
| KR | 1020190101605 | 9/2019 |
| WO | WO 2020/027804 | 2/2020 |

OTHER PUBLICATIONS

European Search Report dated Feb. 14, 2024 issued in counterpart application No. 21901100.4-1224, 10 pages.

ELECTRONIC DEVICE INCLUDING FLEXIBLE DISPLAY AND CAMERA

CROSS-REFERENCE TO RELATED APPLICATIONS

This application is a bypass continuation of International Application No. PCT/KR2021/018300 designating the United States, filed on Dec. 3, 2021, in the Korean Intellectual Property Receiving Office, which claims priority to Korean Patent Application Nos. 10-2020-0168176 and 10-2021-0028640, filed on Dec. 4, 2020 and Mar. 4, 2021, respectively, in the Korean Intellectual Property Office, the disclosures of all of which are incorporated herein by reference in their entireties.

BACKGROUND

1. Field

The disclosure relates generally to an electronic device, and more particularly, to an electronic device including a flexible display and a camera disposed adjacent to the flexible display.

2. Description of Related Art

With the development of mobile communication technologies and processor technologies, portable electronic devices (also referred to as electronic devices herein) have been developed with various functions in addition to conventional telephone communication functions. Electronic devices may include displays for outputting images generated through various applications, thereby providing various user experiences through the displays. The size of an electronic device may be limited for ease in carrying the electronic device, and various display form factors have been developed enabling displays to be expanded or reduced, in line with user demands for larger screens. For example, an electronic device may use a flexible display (or rollable display) made of a bendable material, such that the display can be expanded or reduced in a sliding manner.

An electronic device may have cameras disposed on the front surface and/or rear surface thereof. When an electronic device includes a display that can be expanded or reduced in the sliding manner described above, the position of the cameras may be moved as the display is expanded or reduced. Accordingly, various circuit configurations for forming electric paths may be necessary in connection with the cameras, for the purpose of battery power supply and/or processor signal transfer.

If an electronic component is mounted inside the housing of an electronic device in order to form an electric path between a camera and a main printed circuit board (PCB), power loss may increase due to the lengthened electric path, electro-magnetic interference (EMI) characteristics may be degraded by the sliding-in and sliding-out operations of the display, and/or an inner space may need to be established where corresponding electronic components are disposed.

SUMMARY

Various embodiments of the disclosure provide a flexible display device capable of forming an electric path between a camera and a circuit board (e.g., a main PCB) with a less complex structure.

According to an aspect, an electronic device is provided that includes a first housing, a second housing configured to be slidable from the first housing, and a main printed circuit board (PCB) disposed inside the first housing and including a processor mounted therein. The electronic device also includes a camera module disposed in the second housing, and a display module. The display module includes a display having a first region exposed externally and a second region within an internal space of the first housing, while in a slide-in state of the second housing. The display module also includes a first flexible PCB (FPCB) connected to the main PCB. At least a portion of the first FPCB is movable as the second housing slides out from the first housing. The camera module is electrically connected to the first FPCB to transmit and receive electrical signals to and from the processor mounted on the main PCB.

According to an aspect, an electronic device is provided that includes a first housing, a second housing configured to be slidable from the first housing, and a main PCB disposed inside the first housing and including a processor mounted thereon. The electronic device also includes a camera module disposed in the second housing, and a display including a first region exposed externally and a second region in an internal space of the first housing, while in a slide-in state of the second housing. The electronic device further includes a first FPCB configured to be connected to the main PCB. At least a portion of the first FPCB is movable as the second housing slides out from the first housing. The camera module is electrically connected to the first FPCB to transmit and receive electrical signals to and from the processor mounted on the main PCB.

With respect to an electronic device having a flexible display and a camera, an electric path may be formed between the camera and the main PCB in a less complex structure, thereby securing an inner space and reducing power loss and EMI characteristic degradation.

Various other advantageous effects identified directly or indirectly through the disclosure may be provided.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
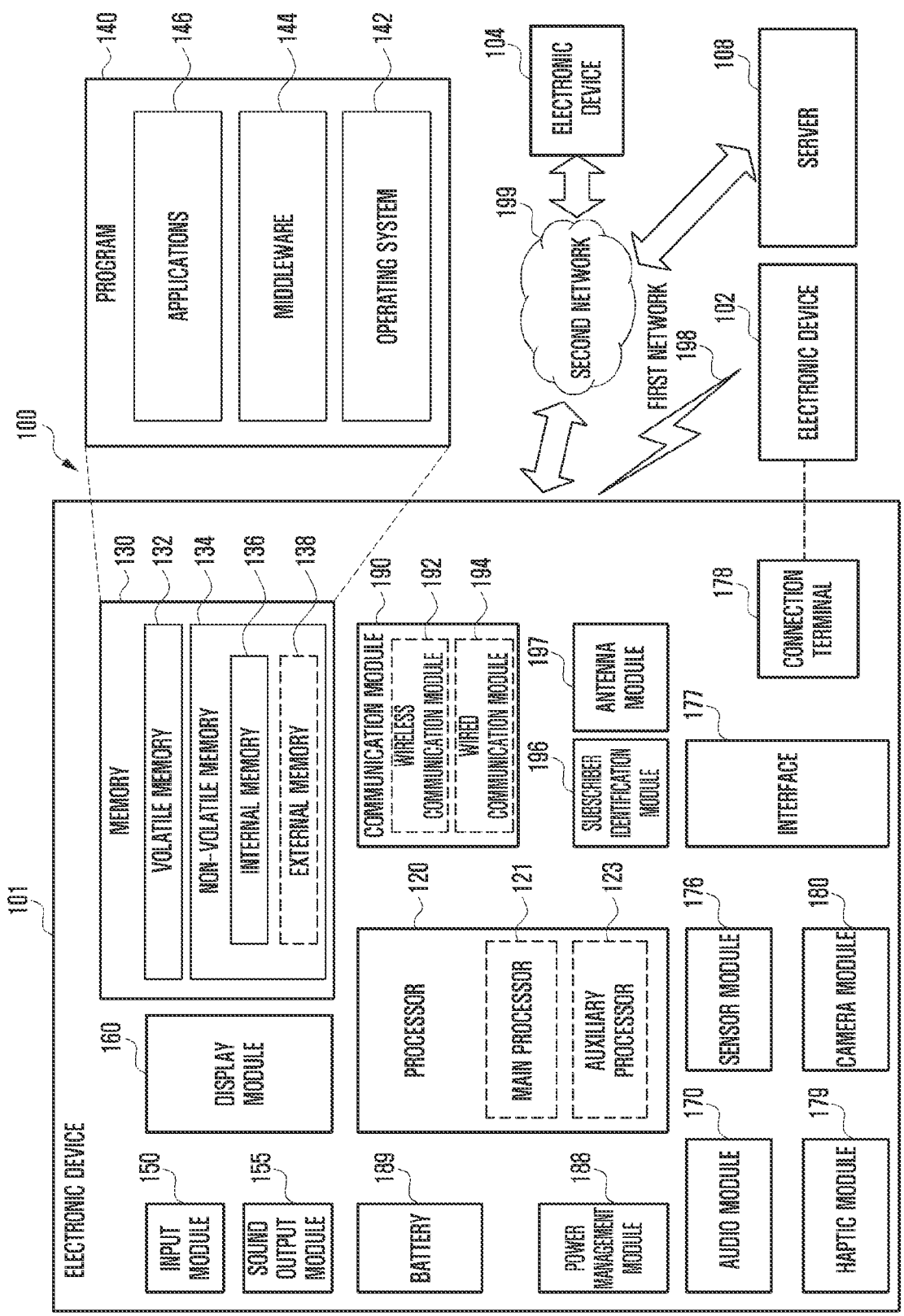
FIG. 1 is a block diagram illustrating an electronic device in a network environment, according to an embodiment.

Embodiments are described in detail with reference to the accompanying drawings. The same or similar components may be designated by the same or similar reference numerals although they are illustrated in different drawings. Detailed descriptions of constructions or processes known in the art may be omitted to avoid obscuring the subject matter of the disclosure. The embodiments and the terms used therein are not intended to limit the technology disclosed herein to specific forms, and should be understood to include various modifications, equivalents, and/or alternatives to the corresponding embodiments. A singular expression may include a plural expression unless they are definitely different in a context.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2A:
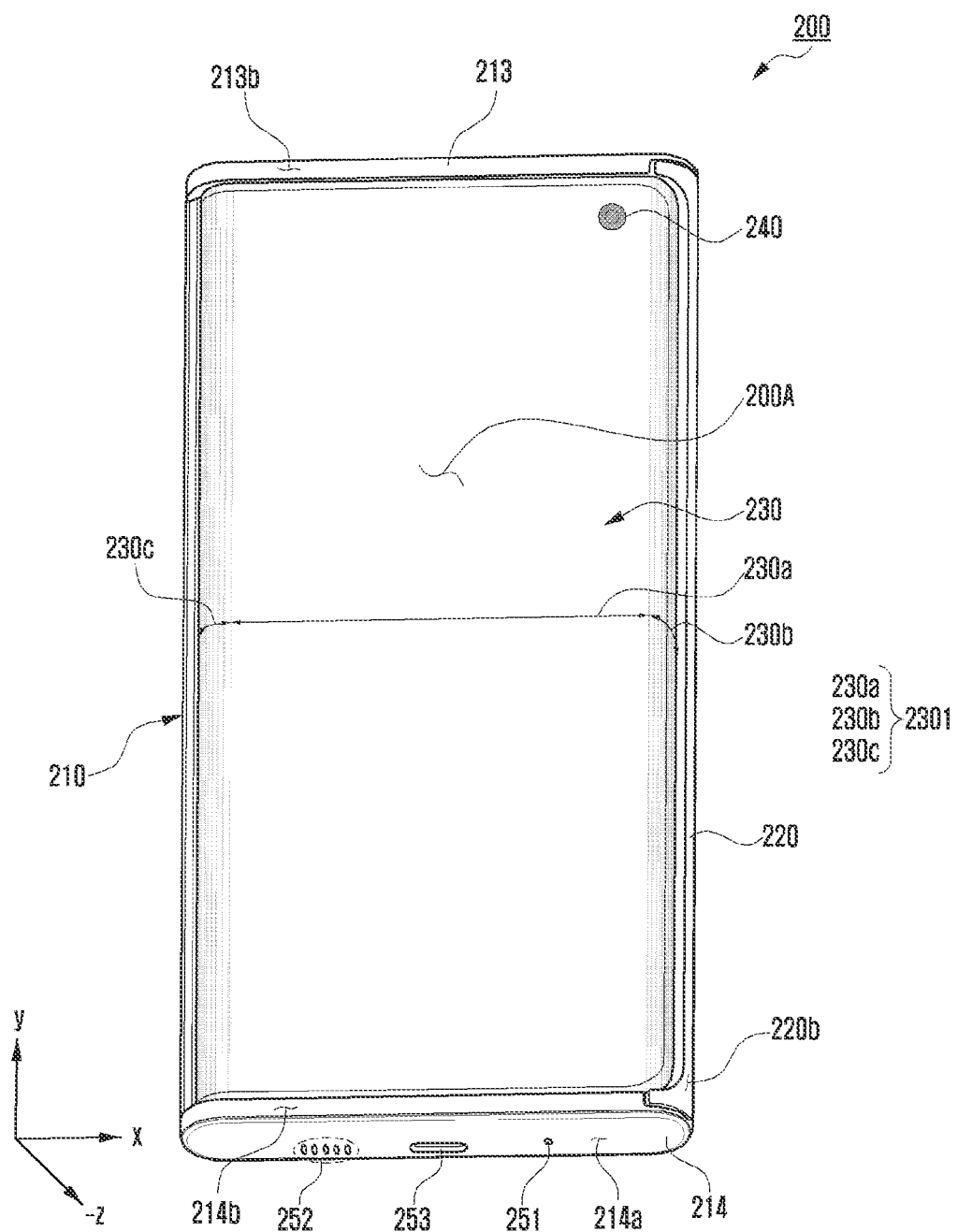
FIG. 2A is a diagram illustrating a front perspective view of an electronic device in a slide-in state, according to an embodiment.
Figure 2B:
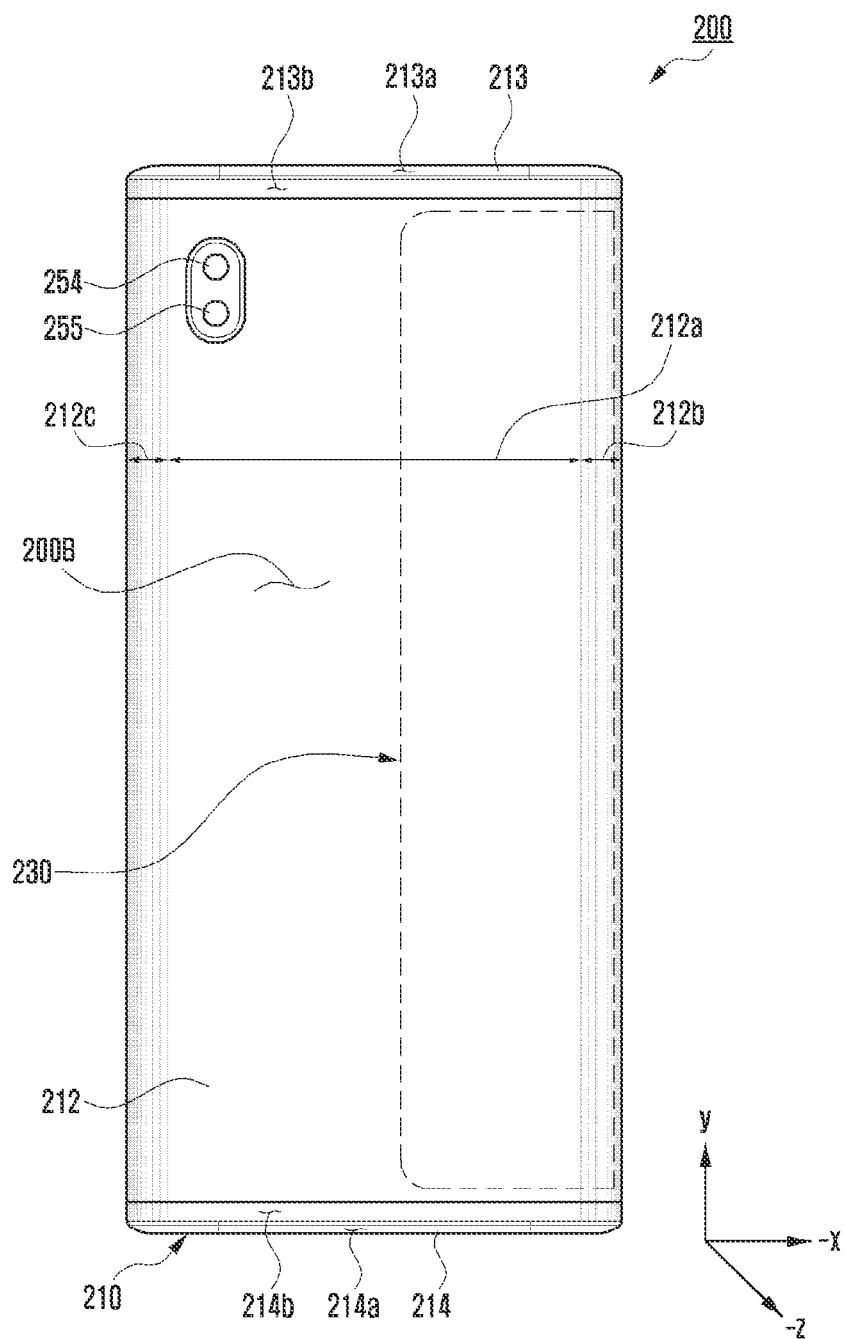
FIG. 2B is a diagram illustrating a rear perspective view of an electronic device in a slide-in state, according to an embodiment.
Figure 3A:
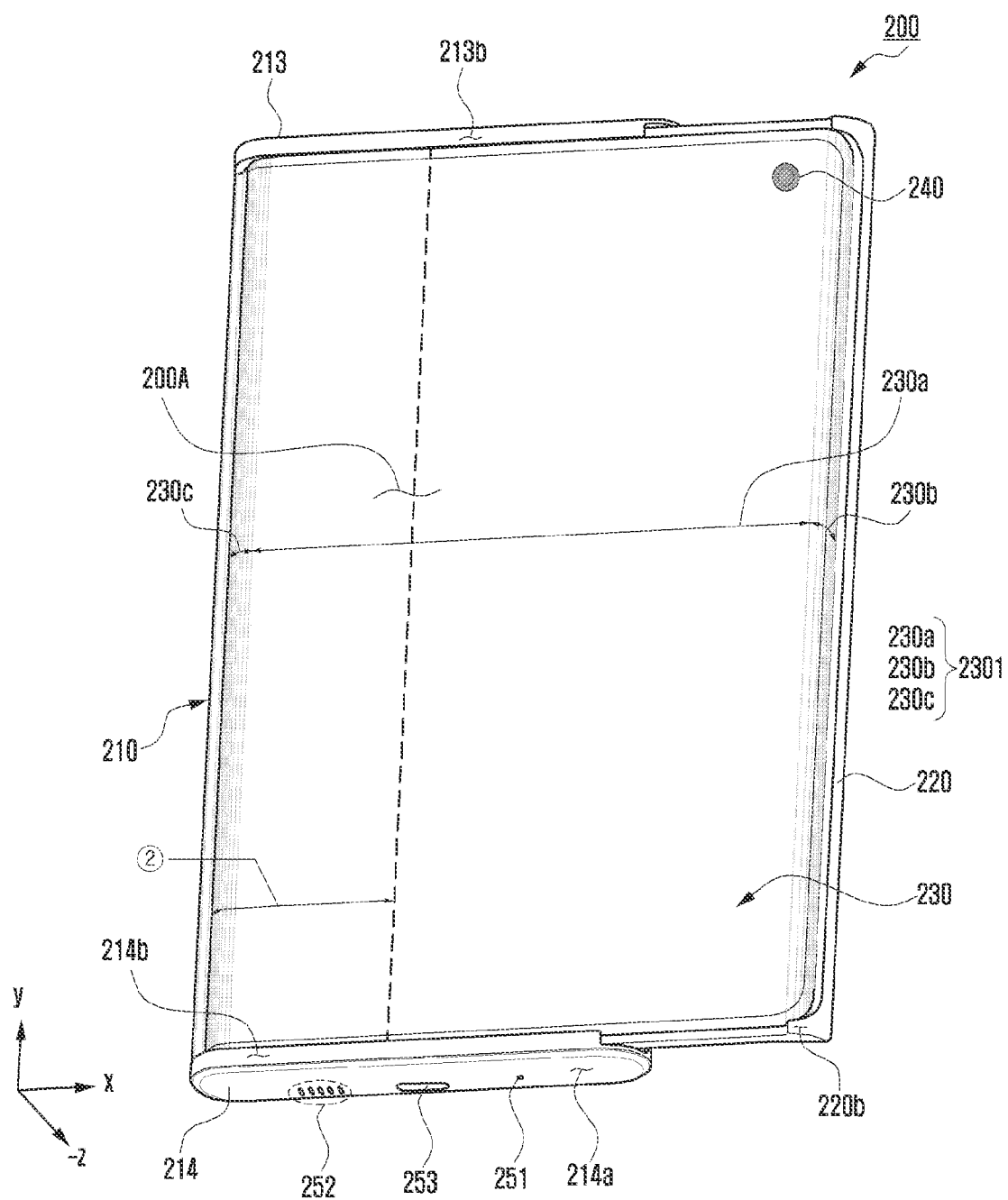
FIG. 3A is a diagram illustrating a front perspective view of an electronic device in a slide-out state, according to an embodiment.
Figure 3B:
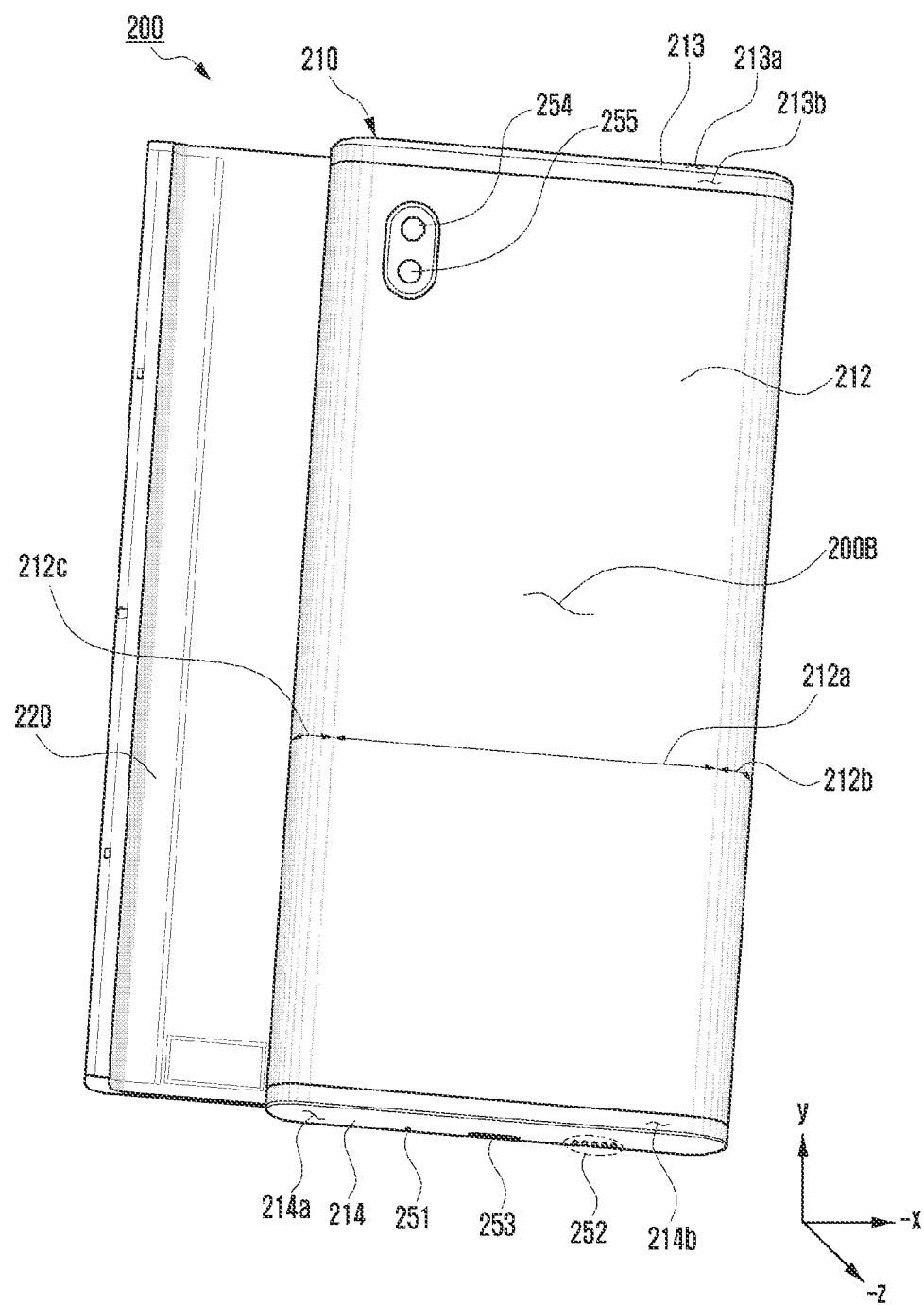
FIG. 3B is a diagram illustrating a rear perspective view of an electronic device in a slide-out state, according to an embodiment.

Hereinafter, a structure of an electronic device including a flexible display, which is expandable in a sliding manner, and a camera are described with reference to FIGS. 2A, 2B, 3A, and 3B. FIG. 2A is a diagram illustrating a front perspective view of an electronic device in a slide-in state, according to an embodiment. FIG. 2B is a diagram illustrating a rear perspective view of an electronic device in a slide-in state, according to an embodiment. FIG. 3A is a diagram illustrating a front perspective view of an electronic device in a slide-out state, according to an embodiment. FIG. 3B is a diagram illustrating a rear perspective view of an electronic device in a slide-out state, according to an embodiment.

An electronic device 200 may be implemented to expand a screen 2301 in a sliding manner. For example, the screen 2301 may be an externally viewed area of a flexible display 230. The flexible display 230 may also be referred to as a rollable display, a slidable display, a slide-out display, or an expandable display.

For example, the slide-in state may be referred to as a slide-in form, and the slide-out state may be referred to as a slide-out form. In addition, the slide-in state may include a basic state, a reduced state, and a closed state, and the slide-out state may include an expanded state and an open state. In addition, the electronic device 200 may be in a state between the slide-in state and the slide-in state, such as, for example, a free stop state.

FIGS. 2A and 2B illustrate the electronic device 200 in a state in which the screen 2301 is not expanded, and FIGS. 3A and 3B illustrate the electronic device 200 in a state in which the screen 2301 is expanded. The state in which the screen 2301 is not expanded is a state in which a sliding plate 220 for a sliding motion of the display 230 does not slide-out, which may be referred to, herein, as a closed state or slide-in state. The state in which the screen 2301 is expanded is a state in which the screen 2301 is at least partially or maximally expanded by sliding out of the sliding plate 220, which may be referred to, herein, as an open state or a slide-out state. For example, the slide-out motion may be at least partially moving the sliding plate 220 in a first direction (e.g., an +x-axis direction) when the electronic device 200 is switched from the closed state to the open state. The open state may be defined as a state in which the screen 2301 is expanded compared to the closed state, and screens of various sizes may be provided according to the movement position of the sliding plate 220.

The screen 2301 may include an active area of the flexible display 230 that is visually exposed to output an image, and the electronic device 200 may adjust the active area according to the movement of the sliding plate 220 or the movement of the flexible display 230.

The electronic device 200 may include a sliding structure related to the flexible display 230. For example, when the flexible display 230 is moved a predetermined distance by an external force, the electronic device 200 may be switched from a closed state to an open state, or from an open state to a closed state, without any external force due to an elastic structure included in the sliding structure (e.g., semi-automatic slide motion).

When a signal is generated through an input device included in the electronic device 200, the electronic device 200 may be switched from a closed state to an open state, or from an open state to a closed state, by a driving device such as a motor connected to the flexible display 230. For example, when a signal is generated through a hardware button or a software button provided through a screen, the electronic device 200 may be switched from a closed state to an open state, or from an open state to a closed state.

When signals are generated from various sensors such as a pressure sensor, the electronic device 200 may be switched from a closed state to an open state, or from an open state to a closed state. For example, when a user carries or holds the electronic device 200, a squeeze gesture in which a part of the hand (e.g., the palm of the hand or a finger) presses within a designated section of the electronic device 200 may be detected by the sensor, and in response, the electronic device 200 may be switched from a closed state to an open state, or from an open state to a closed state.

The display 230 includes a second section ②, as shown in FIG. 3A. The second section ② includes an extended portion of the screen 2301 when the electronic device 200 is switched from a closed state to an open state. When the electronic device 200 is switched from the closed state to the open state, the second section ② may be retracted from the internal space of the electronic device 200 in a slidable manner, and thus, the screen 2301 may be expanded. When the electronic device 200 is switched from the open state to the closed state, at least a portion of the second section ② may be inserted into the internal space of the electronic device 200 in a slidable manner, and thus, the screen 2301 may be reduced. When the electronic device 200 is switched from the open state to the closed state, the at least a portion of the second section ② may be bent and moved to the internal space of the electronic device 200. For example, the flexible display 230 may include a flexible substrate (e.g., a plastic substrate) made of a polymer material including polyimide (PI) or polyester (PET). The second section ② may be a portion of the flexible display 230 that is bent when the electronic device 200 is switched between the open state and the closed state, and may be referred to as, for example, a bendable section.

The electronic device 200 includes a housing 210, the sliding plate 220, and the flexible display 230.

The housing (or the case) 210 includes, for example, a back cover 212, a first side cover 213, and a second side cover 214. The back cover 212, the first side cover 213, and the second side cover 214 may be connected to a support member positioned inside the electronic device 200, and may form at least a portion of the exterior of the electronic device 200.

The back cover 212 forms at least a portion of a rear surface 200B of the electronic device 200. The back cover 212 may be substantially opaque. For example, the back cover 212 may be provided by coated or tinted glass, ceramic, polymer, metal (e.g., aluminum, stainless steel (STS), or magnesium), or a combination of at least two of the aforementioned materials. In a state in which the bendable section ② of the flexible display 230 is inserted into the internal space of the housing 210 (e.g., in a closed state), at least a portion of the bendable section ② may be arranged to be visible from the outside through the back cover 212. In this case, the back cover 212 may be made of a transparent material and/or a translucent material.

The back cover 212 includes a planar portion 212a and curved portions 212b and 212c positioned at opposite sides with the planar portion 212a interposed therebetween. The curved portions 212b and 212c may be provided adjacent to both relatively long edges of the back cover 212, respectively, and may be bent toward the screen positioned opposite the back cover 212 to extend seamlessly. The back cover 212 may include one of the curved portions 212b and 212c or may be implemented without the curved portions 212b and 212c.

The first side cover 213 and the second side cover 214 are positioned opposite each other. For example, the first side cover 213 and the second side cover 214 are positioned opposite each other with the flexible display 230 interposed therebetween in a second direction (e.g., a y-axis direction), substantially orthogonal to a first direction (e.g., a +x-axis direction) of the sliding-out of the sliding plate 220. The first side cover 213 forms at least a portion of the first side surface 213a of the electronic device 200, and the second side cover 214 forms at least a portion of a second side surface 214a of the electronic device 200 facing in a direction opposite the first side surface 213a. The first side cover 213 includes a first rim 213b extending from an edge of the first side cover 213a. For example, the first rim 213b may form at least a portion of one side bezel of the electronic device 200. The second side cover 214 includes a second rim 214b extending from an edge of the second side surface 214a. For example, the second rim 214b may form at least a portion of the other side bezel of the electronic device 200. In the closed state of FIG. 2A, the surface of the first rim 213b, the surface of the second rim 214b, and the surface of the sliding plate 220 may be smoothly connected to one another to form one side curved portion corresponding to the first curved portion 230b of the screen 2301. The surface of the first rim 213b or the surface of the second rim 214b may include the other side curved portion corresponding to the second curved portion 230c of the screen 2301 positioned opposite the first curved portion 230b.

The sliding plate 220 may slide on a support member positioned inside the electronic device 200. At least a portion of the flexible display 230 may be disposed on the sliding plate 220, and the closed state of FIG. 2A or the open state of FIG. 3A may be provided based on the position of the sliding plate 220 on the support member. The flexible display 230 may be attached to the sliding plate 220 through an adhesive member (or a gluing member). The adhesive member may include a thermally responsive adhesive member, a photoreactive adhesive member, a general adhesive, and/or a double-sided tape. The flexible display 230 may be inserted into a recess formed in the sliding plate 220 in a sliding manner to be disposed and fixed to the sliding plate 220. The sliding plate 230 serves to support at least a portion of the flexible display 230, and may also be referred to as a display support structure.

The sliding plate 220 includes a third rim 220b that forms an outer surface (e.g., a surface that is exposed to the outside) to form the exterior of the electronic device 200. For example, the third rim 220b may form a bezel around the screen together with the first rim 213b and the second rim 214b in the closed state of FIG. 2A. The third rim 220b extends in the second direction (e.g., the y-axis direction) to connect one end of the first side cover 213 and one end of the second side cover 214 in the closed state. For example, in the closed state of FIG. 2A, the surface of the third rim 220b may be smoothly connected to the surface of the first rim 213b and/or the surface of the second rim 214b.

Due to the sliding out of the sliding plate 220, as at least a portion of the bendable section ② is extracted from inside of the electronic device 200, and a state in which the screen 2301 is expanded (e.g., the open state) is provided, as shown in FIG. 3A.

In the closed state of FIG. 2A, the screen 2301 includes a planar portion 230a, and a first curved portion 230b and a second curved portion 230c positioned opposite each other with the planar portion 230a interposed therebetween. For example, the first curved portion 230b and the second curved portion 230c may be substantially symmetrical with the planar portion 230a interposed therebetween. In the closed state of FIG. 2A, the first curved portion 230b and the second curved portion 230c may be positioned to correspond to the curved portions 212b and 212c of the back cover 212, respectively, and may be bent toward the back cover 212. When the electronic device 200 is switched from the closed state of FIG. 2A to the open state of FIG. 3A, the planar portion 230a is expanded. For example, a partial region of the bendable section ② forming the second curved portion 230c in the closed state of FIG. 2A is included in the planar portion 230a, which is expanded when the electronic device 200 is switched from the close state of FIG. 2A to the open state of FIG. 3A, and may be provided as another region of the bendable section ②.

The electronic device 200 may include an opening for extraction and insertion of the bendable section ②, and/or a pulley positioned in the opening. The pulley may be positioned to correspond to the bendable section ②, and the movement of the bendable section ② and the direction of the movement of the bendable section ② may be guided through the rotation of the pulley in the transition between the closed state of FIG. 2A and the open state of FIG. 3A. The first curved portion 230b may correspond to a curved surface provided on one surface of the sliding plate 220. The second curved portion 230c may correspond to the curved surface of the pulley in the bendable section ②. The first curved portion 230c may be positioned opposite the second curved portion 230b in the closed or open state of the electronic device 200 to improve the aesthetics of the screen 2301. The planar portion 230a may be implemented to be expanded without the first curved portion 230b.

The flexible display 230 may further include a touch sensing circuit (e.g., a touch sensor). The flexible display 230 may be coupled to or disposed adjacent to a pressure sensor capable of measuring the intensity (or pressure) of a touch, and/or a digitizer that detects a magnetic field type pen input device (e.g., a stylus pen). For example, the digitizer may include a coil member disposed on a dielectric substrate to detect a resonance frequency of an electromagnetic induction method applied from the pen input device.

The electronic device 200 includes a microphone hole 251 (e.g., the input module 150 of FIG. 1), a speaker hole 252 (e.g., the sound output module 155 of FIG. 1), a connector hole 253 (e.g., the connectivity terminal 178 of FIG. 1), a camera module 240 or 254 (e.g., the camera module 180 of FIG. 1), and a flash 255. The flash 255 may be implemented by being included in the camera module 254. The electronic device 200 may omit at least one of the components or include additional components.

The microphone hole 251 may be provided, for example, in at least a portion of the second side surface 214a that corresponds to a microphone positioned inside the electronic device 200. The position of the microphone hole 251 is not limited to the embodiment of FIG. 2A. The electronic device 200 may include a plurality of microphones capable of detecting the direction of sound.

The speaker hole 252 may be provided, for example, in at least a portion of the second side surface 214a and corresponds to a speaker positioned inside the electronic device 200. The position of the speaker hole 252 is not limited to the embodiment of FIG. 2A. The electronic device 200 may include a call receiver hole. The microphone hole 251 and the speaker hole 252 may be implemented as one hole, or the speaker hole 252 may be omitted such as in a piezo speaker.

The connector hole 253 may be provided, for example, in at least a portion of the second side surface 214a that corresponds to a connector (e.g., a USB connector) positioned inside the electronic device 200. The electronic device 200 may transmit and/or receive power and/or data to and/or from an external electronic device electrically connected to the connector through the connector hole 253. The position of the connector hole 253 is not limited to the embodiment of FIG. 2A.

The camera modules 240 and 254 may be arranged on the front and rear surface of the electronic device. A camera module may include one or more lenses, an image sensor, and/or an image signal processor. The camera module includes the flash 255, and the flash 255 may include a light emitting diode or a xenon lamp. Two or more lenses (e.g., infrared camera, wide-angle, and telephoto lenses) and image sensors may be positioned on one surface of the electronic device 200. On the front and/or rear surfaces of the electronic device 200, a plurality of camera modules (e.g., a dual camera or a triple camera) having different properties (e.g., angle of view) or functions may be arranged. For example, a plurality of camera modules including lenses having different angles of view may be configured, and the electronic device 200 may control to change the angle of view of the camera module performed in the electronic device 200 based on a user's selection. In addition, the plurality of camera modules may include at least one of a wide-angle camera, a telephoto camera, a color camera, a monochrome camera, or an infrared (IR) camera (e.g., a time of flight (TOF) camera or a structured light camera). The IR camera may be operated as at least a part of a sensor module.

Referring to FIGS. 2A and 3A, the front camera module 240 is disposed in one area of the flexible display 230, and the front camera module 240 is moved according to the movement of the sliding plate 220 at the time of a sliding-out operation. In FIGS. 2A and 3A, the front camera module 240 is illustrated as being disposed on the upper right side of the flexible display 230, but the position of the front camera module 240 is not limited thereto. The front camera module 240 may be disposed in various positions such as the upper center or center of the flexible display 230.

The front camera module 240 may be aligned with an opening (e.g., a punch hole or a notch) provided in the flexible display 230, and may be positioned inside the housing 210. The front camera module 240 may generate an image signal by receiving light through the opening and a partial region of a transparent cover overlapping the opening. The transparent cover serves to protect the flexible display 230 from the outside, and may include, for example, a material such as polyimide or ultra-thin glass (UTG) or transparent glass.

Alternatively, the front camera module 240 may be disposed at the lower end of at least a portion of the screen 2301 of the flexible display 230. In this case, the position of the front camera module 240 is not visually distinguished (or exposed), and a related function (e.g., image photography) may be performed. For example, when viewed from the top of the screen 2301 (e.g., when viewed in a −z axis direction), the front camera module 240 may be disposed to overlap at least a portion of the screen 2301, thereby acquiring an image of an external subject without being exposed to the outside.

The electronic device 200 includes the rear camera module 254 and the flash 255 in at least a partial area of the back cover 212. Since the rear camera module 254 is positioned on the back cover 212 of the housing, the position of the rear camera module 254 is not changed during the slide-out operation.

The electronic device 200 may further include a key input device (e.g., the input module 150). The key input device may be positioned, for example, on the first side surface 213a of the electronic device 200 provided by the first side cover 213. The key input device may include at least one sensor module.

The electronic device 200 may include various sensor modules (e.g., the sensor module 176). A sensor module may generate an electrical signal or data value corresponding to an internal operating state of the electronic device 200 or an external environmental state. For example, a sensor module may include a proximity sensor that receives light through a front surface 200A of the electronic device 200 placed in a direction in which the screen 2301 faces and generates a signal regarding the proximity of an external object based on the received light. In another example, a sensor module may include various biometric sensors such as a fingerprint sensor for detecting biometric information based on light received through the front surface 200A or rear surface 200B of the electronic device 200, or a heart rate monitor (HRM) sensor. The electronic device 200 may include at least one of various sensor modules, for example, a gesture sensor, a gyro sensor, a barometric pressure sensor, a magnetic sensor, an acceleration sensor, a grip sensor, a color sensor, an infrared (IR) sensor, a biometric sensor, a temperature sensor, a humidity sensor, or an illuminance sensor.

The electronic device 200 is not limited to the embodiments of FIGS. 2A, 2B, 3A, and 3B, and the electronic device 200 may be implemented to have a structure in which the screen is expanded from the third rim 220b at the time of sliding-out of the sliding plate 220. For example, a partial area of the flexible display 230 that forms the first curved portion 230b in the closed state of FIG. 2A may be included in the expanded planar portion 230a at the time of transition from the closed state of FIG. 2A to the open state of FIG. 3A, and may be provided in another area of the flexible display 230.

Figure 4A:
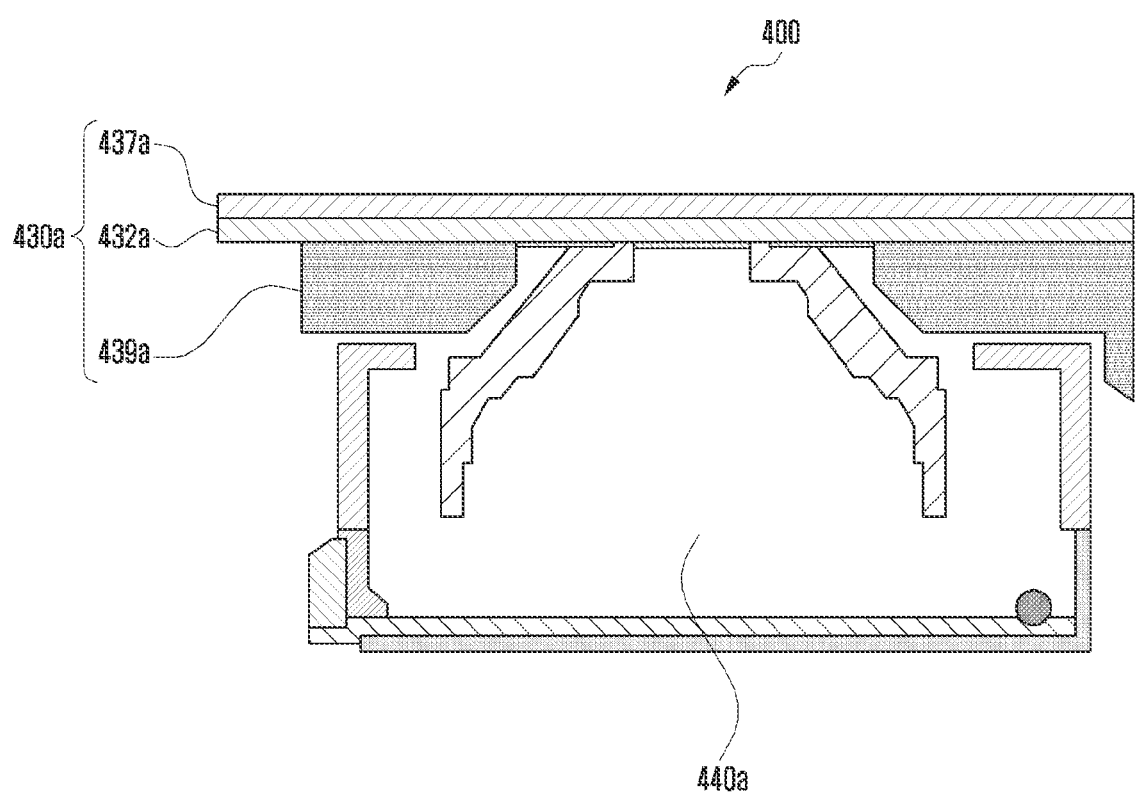
FIGS. 4A and 4B are diagrams illustrating a front camera disposed in an electronic device, according to an embodiment.
Figure 4B:
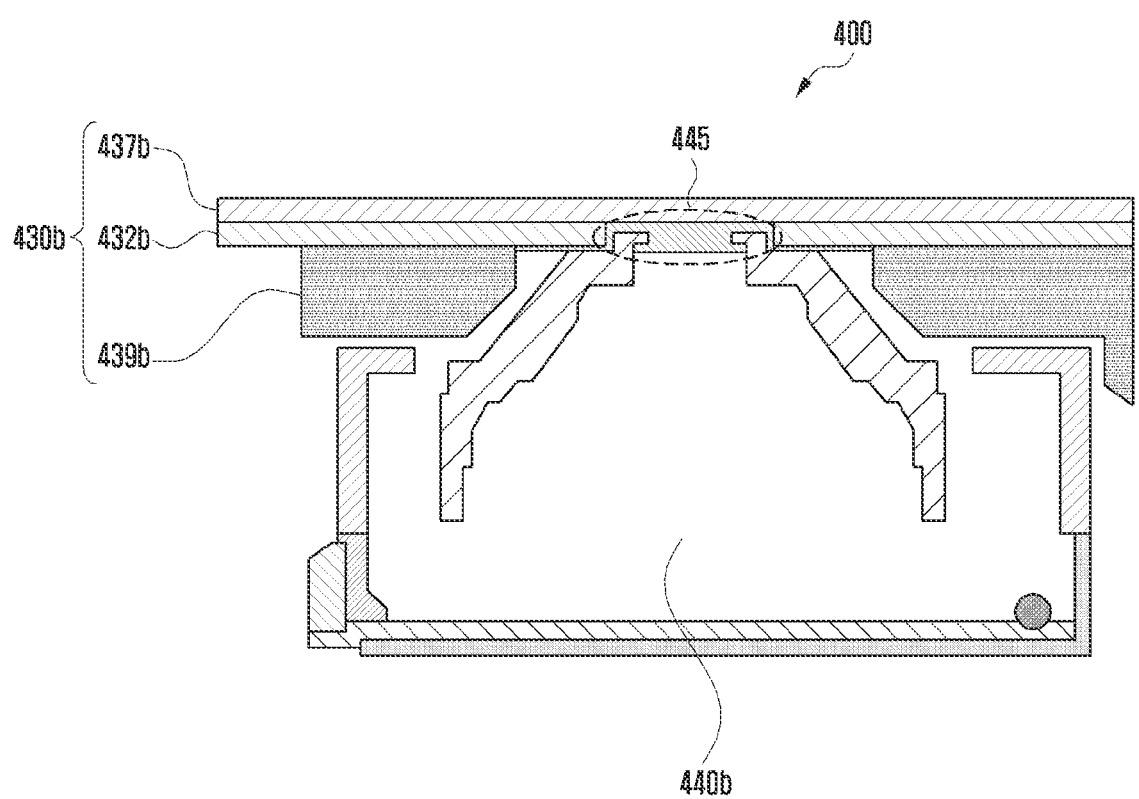

FIGS. 4A and 4B are diagrams illustrating a front camera disposed in an electronic device, according to an embodiment.

The front camera module 240 may be disposed below the flexible display 230 or may be disposed below an area that is partially removed from the display module.

Referring to FIG. 4A, a display module 430a includes a transparent cover 437a, a display panel 432a, and a support structure 439a. The transparent cover 437a, the display panel 432a, and the support structure 439a may be sequentially stacked. The transparent cover 437a protects the display panel 432a below the transparent cover 437a from external impact, and may be made of a transparent material to allow light to pass therethrough. For example, the transparent cover 437a may be made of glass or a polymer film such as polyimide or polyethylene terephthalate (PET). The display panel 432a may be disposed below the transparent cover 437a, and the display panel 432a may include an emission layer including a plurality of pixels. The display panel 432a may further include additional layers such as, for example, a polarization layer for polarizing light output from a pixel and an optical layer for improving image quality or visibility. The display panel 432a may be supported by the support structure 439a below the display panel 432a. For example, the support structure 439a may include a protective layer and a shock absorption pattern layer which elastically respond to external impact, and a black layer that blocks or reflects external light.

The display module 430a may be a flexible display of which at least a portion can be bent.

A camera module 440a is disposed below the display panel 432a. Referring to FIG. 4A, the camera module 440a may be disposed in an area that is partially removed from the support structure 439a, which is an opaque material, and the display panel 432a may not be removed from the area. Since at least partial light can be transmitted through the transparent cover 437a and the display panel 432a in the corresponding area, even if the transparent cover 437a and the display panel 432a are disposed on the top of the camera module 440a, the light can be transmitted through the camera module 440a.

When the camera module 440a is operated, an electronic device 400 may deactivate pixels (or pixels corresponding to field of view of the camera module 440a) of the display panel 432a of an area in which the camera module 440a is disposed, so that light output from the pixels of the display panel 432a is not recognized by the camera module 440a. The electronic device 400 may display the pixels of the display panel 432a in the area where the camera module 440a is disposed with a designated brightness (or luminance).

The camera module 440b may be disposed below a partially removed area 445 within a display panel 432b, as shown in FIG. 4B.

The camera module 440b may be disposed on the partially removed area 445. The display panel 432b cannot transmit 100% of light because a transistor, gate wiring, and data wiring are disposed thereon. However, since the camera module 440b is disposed on the area 445 (e.g., notch or punch hole) partially removed from the display panel 432b, the camera module 440b may maximally detect external light.

A display module 430b, a transparent cover 437b, and a support structure 439b of FIG. 4B correspond to the display mode 430a, the transparent cover 437a, and the support structure 439a of FIG. 4A.

Figure 5:
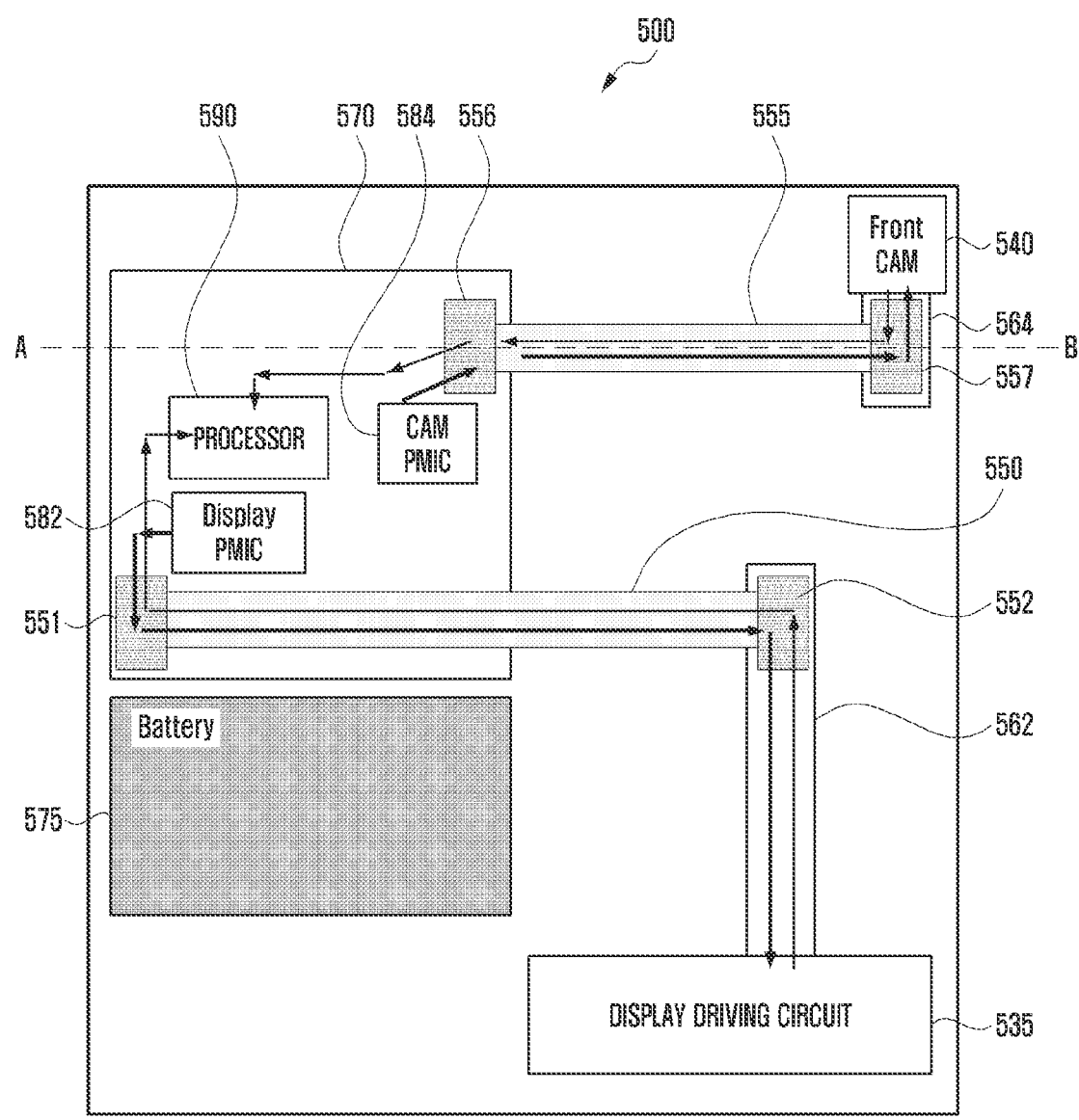
FIG. 5 is a diagram illustrating a front perspective view of an electronic device, according to an embodiment.

FIG. 5 is a diagram illustrating a front perspective view of an electronic device, according to an embodiment.

FIG. 5 illustrates configurations in which an electronic device 500 is disposed inside the housing in a slide-out state.

The electronic device 500 includes a first housing (e.g., the housing 210) and a second housing (e.g., the sliding plate 220) configured to be slidable from the first housing. In FIG. 5, a main PCB 570 and a battery 575 are fixed in the first housing and their positions may not be changed even when the second housing slides in or slides out. A camera module 540 and a display driving circuit 535 are fixed to the second housing and their positions may be changed when the second housing slides in or slides out.

Various electrical components and integrated circuits of the electronic device 500 may be mounted on the main PCB 570. For example, a processor 590 and a camera power management integrated circuit (PMIC) 584, a display PMIC 582 are mounted on the main PCB 570. A power line for supplying power to each component and/or a signal line for transmitting and receiving electrical signals may be provided on the main PCB 570.

The processor 590 may include, for example, an application processor as a component for controlling each component of the electronic device 500. The processor 590 may receive image data obtained from the camera module 540 and may transmit a control signal to the camera module 540.

The camera PMIC 584 may increase or decrease the power output from the battery 575 to a level required for the operation of the camera module 540 to provide the increased or decreased power to the camera. The display PMIC 582 may increase or decrease the power output from the battery 575 to a level required for the operation of the display to provide the increased or decreased power to the display driving circuit 535 and the display. Each component in the main PCB 570 may be connected by wiring.

The camera module 540 is connected to the processor 590 of the main PCB 570 through a first FPCB 555. The first FPCB 555 is a PCB made of a material having a bendable property, and a power line and a signal line may be provided in the first FPCB 555. The first FPCB 555 is fastened to the main PCB 570 through a first connector 556, and thus, the main PCB 570 and the power line and/or signal line of the first FPCB 555 are connected to each other. In addition, the first FPCB 555 is fastened to a third FPCB 557 extending from the camera module 540 through a second connector 564, and thus, the camera module 540 and the power line and/or signal line of the first FPCB 555 are connected to each other.

When the second housing slides out, at least a portion of the first FPCB 555 may be moved. The shape of the first FPCB 555 according to the sliding-in and sliding-out is described in greater detail below with reference to FIG. 6A.

The display driving circuit 535 is connected to the processor 590 of the main PCB 570 through a second FPCB 550. The second FPCB 550 is fastened to the main PCB 570 through a third connector 551, and thus, the main PCB 570 and/or the power line and/or signal line of the second FPCB 550 are connected to each other. In addition, the second FPCB 550 is fastened to a fourth FPCB 562 extending from the display driving circuit 535 through a fourth connector 552, and thus, the display driving circuit 535 and the power line and/or signal line of the second FPCB 550 are connected to each other. The second FPCB 550 may be made of a material having a bendable property like the first FPCB 555, and at least a portion of the second FPCB 550 may be moved when the electronic device 500 slides in and out.

Figure 6A:
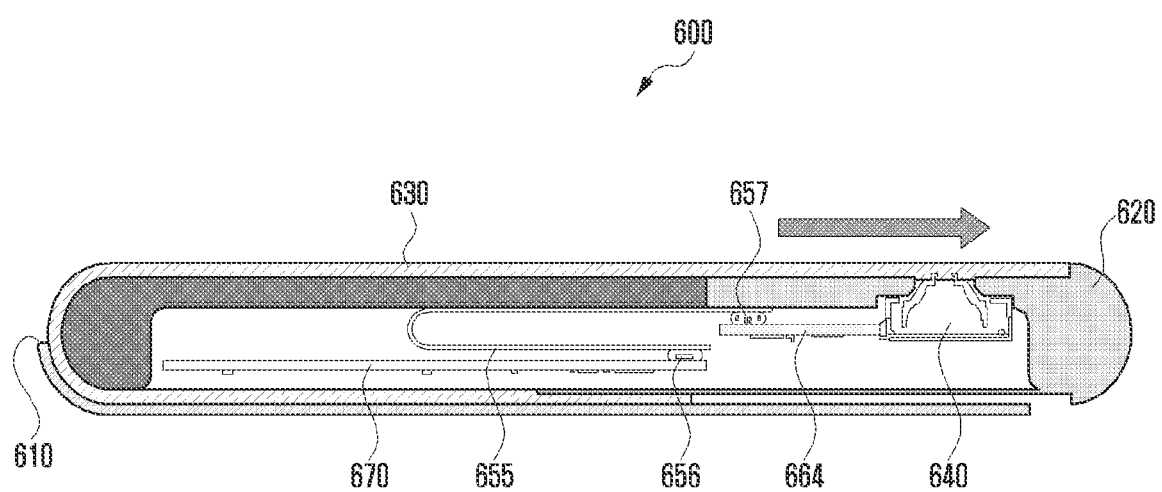
FIG. 6A is a diagram illustrating a side view of a camera arrangement position of an electronic device in a slide-in state, according to an embodiment.
Figure 6B:
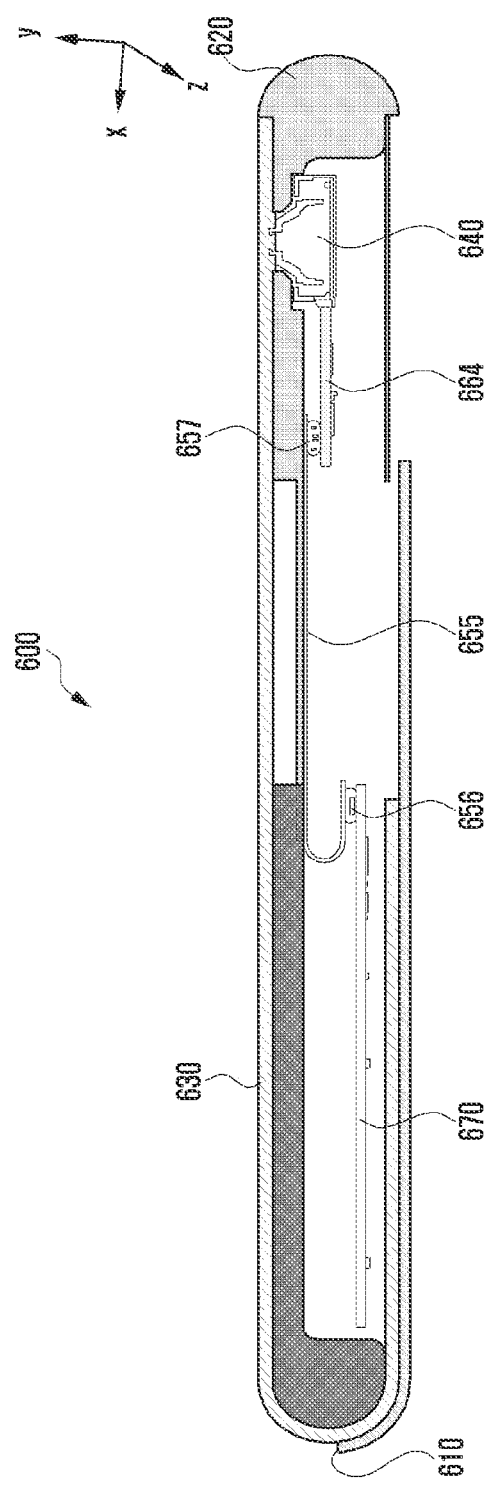
FIG. 6B is a diagram illustrating a side view of a camera arrangement position of an electronic device in a slide-out state, according to an embodiment.

FIGS. 6A and 6B are diagrams illustrating side views of the electronic device at A-B of FIG. 5 where a camera is disposed, according to an embodiment.

Referring to FIG. 6A, in a slide-in state, a first housing 610 and a second housing 620 are in close contact with each other, and thus, at least a portion of a display 630 is received inside the first housing 610 through a rolling structure and is not exposed to the outside.

One side of a first FPCB 655 may be fastened to a main PCB 670 through a first connector 656, and another side thereof may be fastened to a third FPCB 664 extending from a camera module 640 through a second connector 657. The first FPCB 655 may be positioned at least partially in the first housing 610 in a bent shape.

Referring to FIG. 6B, when the second housing 620 slides out, a partial area that was not exposed in the slide-in state may be exposed to the outside with the movement of the second housing 620. In addition, as the second housing 620 is moved, the camera module 640 fixed to the second housing 620 below the display 630 may also be moved.

Since the first FPCB 655 is fastened to the third FPCB 664 extending from the camera module 640 through the second connector 657, the second connector 657 may also be moved according to the movement of the camera module 640 at the time of sliding-out, and thus, the fastening area of the second connector 657 in the first FPCB 655 may also be moved. The first FPCB 655 is fastened to the main PCB 670 through the first connector 656. Since the main PCB 670 is fixed to the first housing 610 and does not move even when the main PCB 670 slides out, the fastening area of the first connector 656 in the first FPCB 655 is fixed. Since the first FPCB 655 is made of a material that can be bent, only the area fastened to the second connector 657 may move at the time of sliding-out, so that the degree of bending may be changed and an electrical connection between the main PCB 670 and the camera module 640 can be maintained.

In the embodiments of FIGS. 5, 6A, and 6B, an electrical connection between the camera module 640 and the main PCB 670 may be provided during the sliding-in and sliding-out.

However, as the camera module 640 and the processor of the main PCB 670 are connected to each other through the first FPCB 655, power performance may decrease. For example, considering that the connector resistance is about 50 mΩ, the resistance of the first FPCB 655 is about 100 mΩ, and the output current is about 0.5 A, the voltage drop due to the first FPCB 655 can be calculated as about 75 mV. Considering that the rated voltage of a general mobile IC is about 100 mV, the first FPCB 655 may consume about 75%, which is the majority of the voltage range. Here, when the resistance of the third FPCB 664 and the main PCB 670 extending from the camera module 640 is also taken into consideration, there is a possibility that the corresponding voltage is out of a normal operable voltage range, and thus, a specific IC may malfunction.

In addition, since the first FPCB 655 is repeatedly bent according to the sliding-in or sliding-out of an electronic device 600, the first FPCB 655 requires a long shape for sliding. Considering the power line and/or signal line disposed in the first FPCB 655, a noise radiation pattern and noise reaching a noise victim (e.g., antenna, IC) may vary when the first FPCB 655 is folded and unfolded. Accordingly, since it is difficult to control noise, EMI performance may be deteriorated.

In addition, for the arrangement of the first FPCB 655, it is necessary to secure a mounting space, and expenses for connecting the first FPCB 655 and/or the connector may be incurred.

FIGS. 7A, 7B, 8, 9A, and 9B illustrate structures without a separate FPCB 655 connecting the camera module and the main PCB, making it is possible to compensate for possible disadvantages described above with respect to FIGS. 5, 6A, and 6B.

Figure 7A:
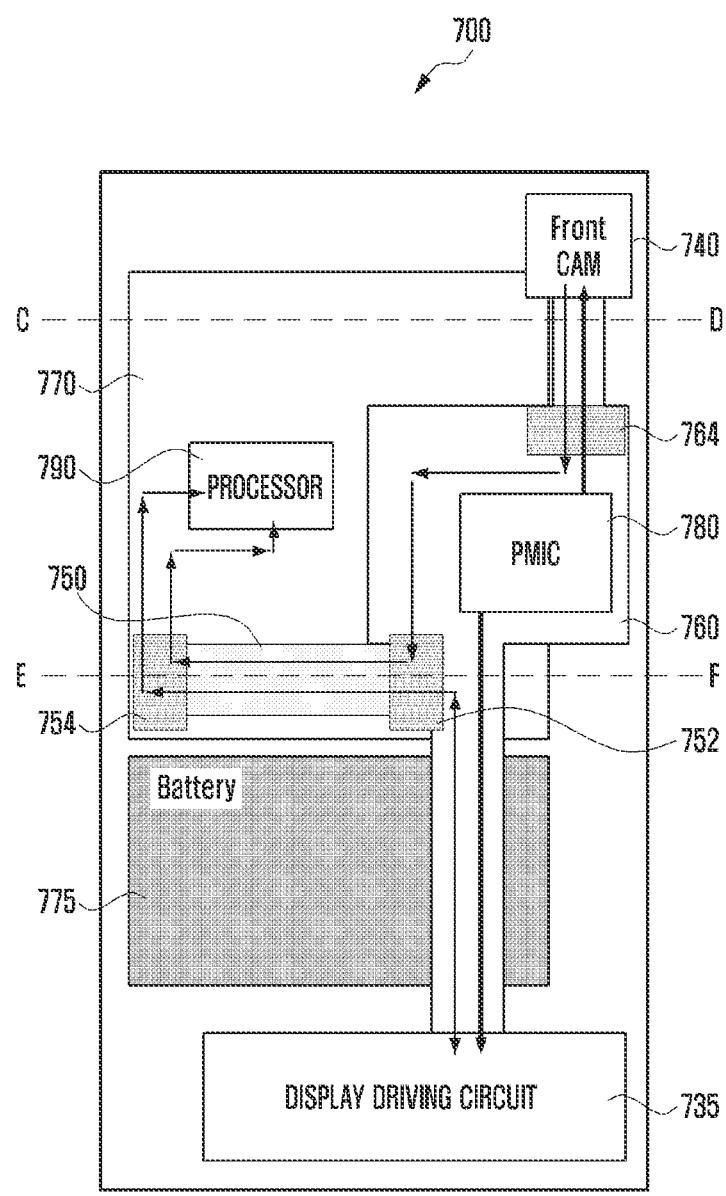
FIG. 7A is a diagram illustrating a front perspective view of an electronic device in a slide-in state, according to an embodiment.
Figure 7B:
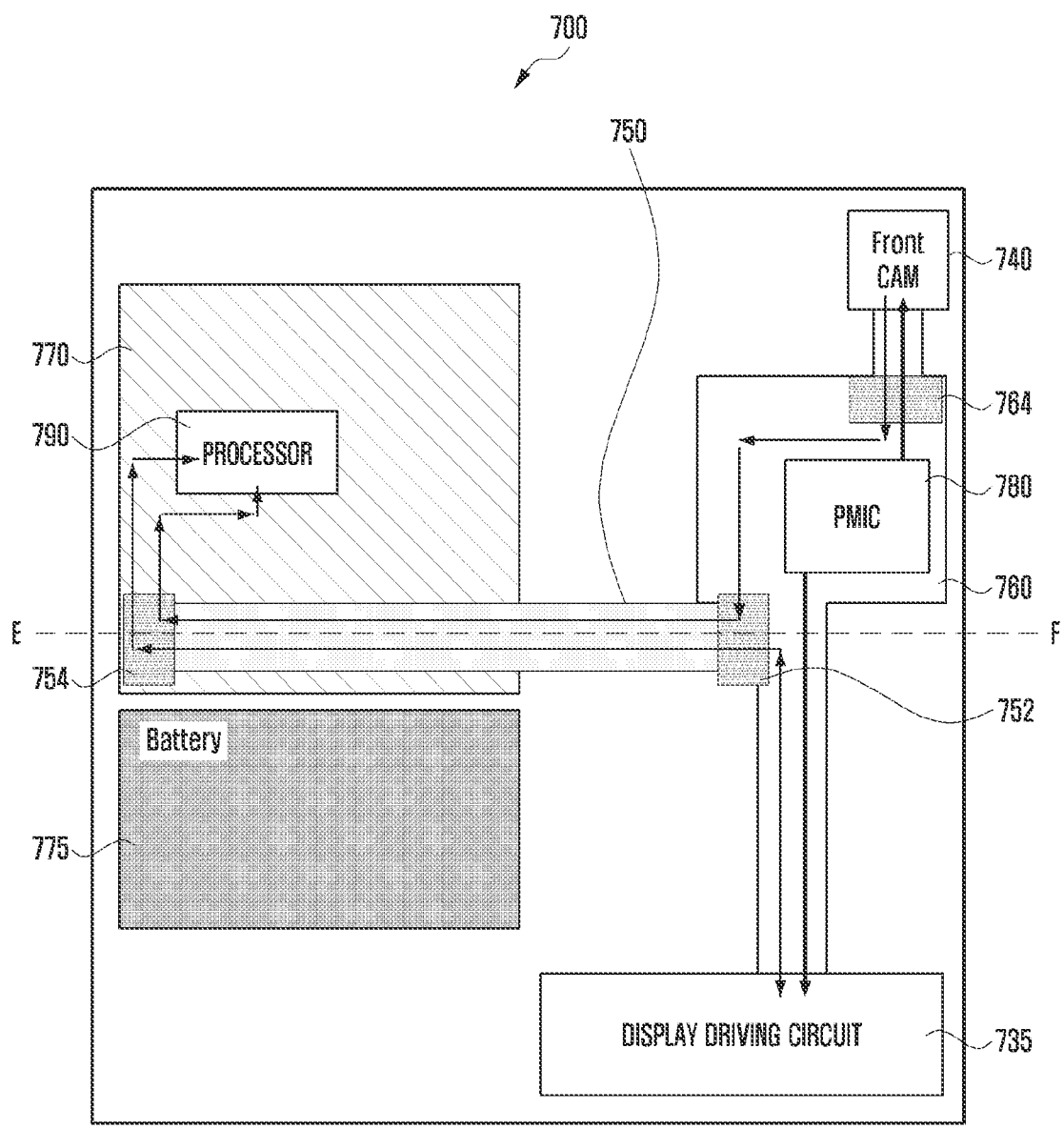
FIG. 7B is a diagram illustrating a front perspective view of an electronic device in a slide-out state, according to an embodiment.

FIG. 7A is a diagram illustrating a front perspective view of an electronic device in a slide-in state, according to an embodiment. FIG. 7B is a diagram illustrating a front perspective view of an electronic device in a slide-out state, according to an embodiment.

An electronic device 700 includes a first housing 210 and a second housing (e.g., the sliding plate) configured to be slidable from the first housing 220.

A first FPCB 750 is electrically connected to a main PCB 770, and at least a portion thereof may be moved as the second housing slides out. A camera module 740 is electrically connected to the first FPCB 750 to transmit/receive electrical signals to/from a processor 790 mounted on the main PCB 770. A display driving circuit 735 is electrically connected to the first FPCB 750 to transmit/receive electrical signals to/from the processor 790 mounted on the main PCB 770.

Referring to FIGS. 7A and 7B, the main PCB 770 and a battery 775 are fixed to the first housing, while the camera module 740, the display driving circuit 735, and a second FPCB 760 are fixed to the second housing. The first FPCB 750 is a PCB composed of a material having a bendable property, and a power line and a signal line may be provided in the first FPCB 750. The main PCB 770 is fastened to the first FPCB 750 through a first connector 754, so that the power line and/or signal line of the main PCB 770 and the first FPCB 750 may be electrically connected.

The camera module 740 and the display driving circuit 735 are connected to the second FPCB 760. For example, the camera module 740 may be connected to the second FPCB 760 through the third connector 764. The second FPCB 760 may be implemented with a bendable or flat material, and may be fixed to the second housing and moved along with the sliding-out of the second housing. The second FPCB 760 may be an FPCB included in the display module.

The second FPCB 760 is fastened to a second connector 752 through the first FPCB 750. Accordingly, image data generated by the camera module 740 may be transmitted to the processor 790 through the signal lines of the second FPCB 760, the second connector 752, the first FPCB 750, and the first connector 754. Data provided from the processor 790 to the display module may be transmitted to the display driving circuit 735 through the signal lines of the first connector 752, the first FPCB 750, the second connector 754, and the second FPCB 760.

A PMIC 780 providing power from the battery 775 to the camera module 740 and the display driving circuit 735 is mounted on the second FPCB 760. The power of the battery 775 may be provided to the PMIC 780 through power lines of the first FPCB 750 and the second FPCB 760, and the PMIC 780 operates the camera module 740 and the display driving circuit 735. The voltage of the PMIC 780 may be increased or decreased according to the operating voltage of the camera module 740 and the display driving circuit 735, and the increased or decreased voltage may be output to the camera module 740 and the display driving circuit 735.

The electronic device 700 may include each independent PMIC excluding the power supply of the camera module 740 and the display driving circuit 735, and in this case, each PMIC may be mounted on the second FPCB 760. In this manner, by arranging the PMIC 780 on the second FPCB 760 at a position close to the camera module 740 and the display, power loss can be reduced compared to the embodiment of FIG. 5.

Referring to FIG. 7A, in a state in which the electronic device 700 slides in, at least a portion of the second FPCB 760, the camera module 740, and/or the display driving circuit 735 is positioned above the main PCB 770 (e.g., in a direction close to the display). Referring to FIG. 7B, when the second housing of the electronic device 700 moves to the right to be in a slide-out state, a horizontal distance (e.g., a distance in a C-D direction) between each of the second FPCB 760, the camera module 740, and the display driving circuit 735 with each of the main PCB 770 and the battery 775 may increase to prevent overlapping in the vertical direction.

When the second housing slides out, at least a portion of the first FPCB 750 may be moved. The shape of the first FPCB 750 according to the sliding-in and sliding-out is described in greater detail below with reference to FIGS. 9A and 9B.

Figure 8:
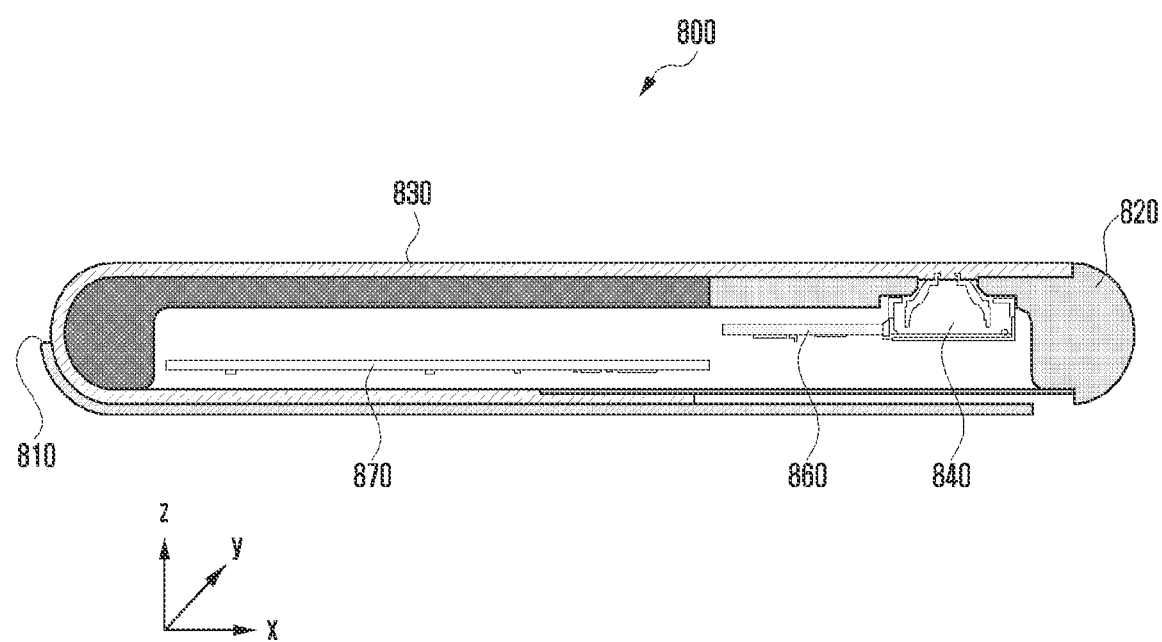
FIG. 8 is a diagram illustrating a side view of a camera arrangement position of an electronic device in a slide-in state, according to an embodiment.

FIG. 8 is a diagram illustrating a side view of a camera arrangement position along C-D of FIG. 7A in a slide-in state of an electronic device, according to an embodiment.

Since a camera module 840 of an electronic device 800 is connected to a first FPCB 750 that is bent at the time of sliding-in and sliding-out through a second FPCB 760 of a display module, a separate FPCB may not be provided on the side surface of the camera module 840. Referring to FIG. 8, in the slide-in state, a first housing 810 and a second housing 820 are in close contact with each other, and thus, at least a portion of a display 830 is received inside the first housing 810 through a rolling structure, and is not exposed to the outside.

Referring to FIG. 8, the camera module 840 is connected to a second FPCB 860, and the second FPCB 860 is provided to be elongated in a y-axis direction (e.g., both +y and −y directions). Since the first FPCB electrically connecting the second FPCB 860 and a main PCB 870 is located below the camera module 840 in the y-axis direction (e.g., the −y direction), a separate FPCB may not be provided on the side surface (e.g., −x direction) of the camera module 840. Accordingly, compared to the embodiment of FIGS. 6A and 6B, there is an advantage in that a space for the arrangement of the FPCB is not required.

Figure 9A:
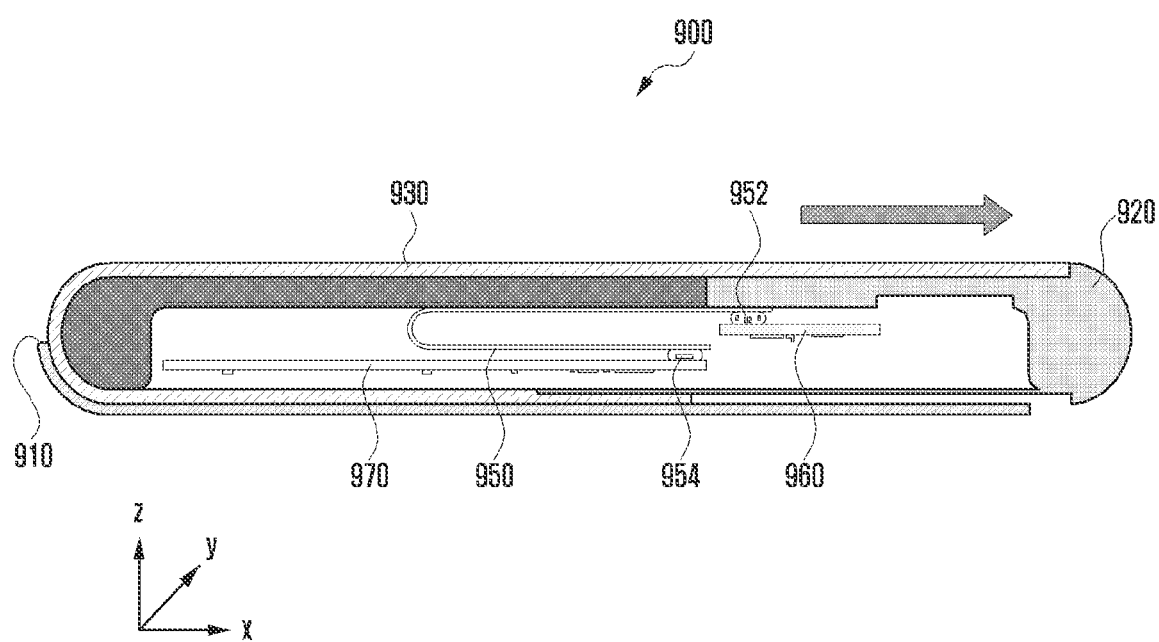
FIG. 9A is a diagram illustrating a side view of a position of a first FPCB of an electronic device in a slide-in state, according to an embodiment.
Figure 9B:
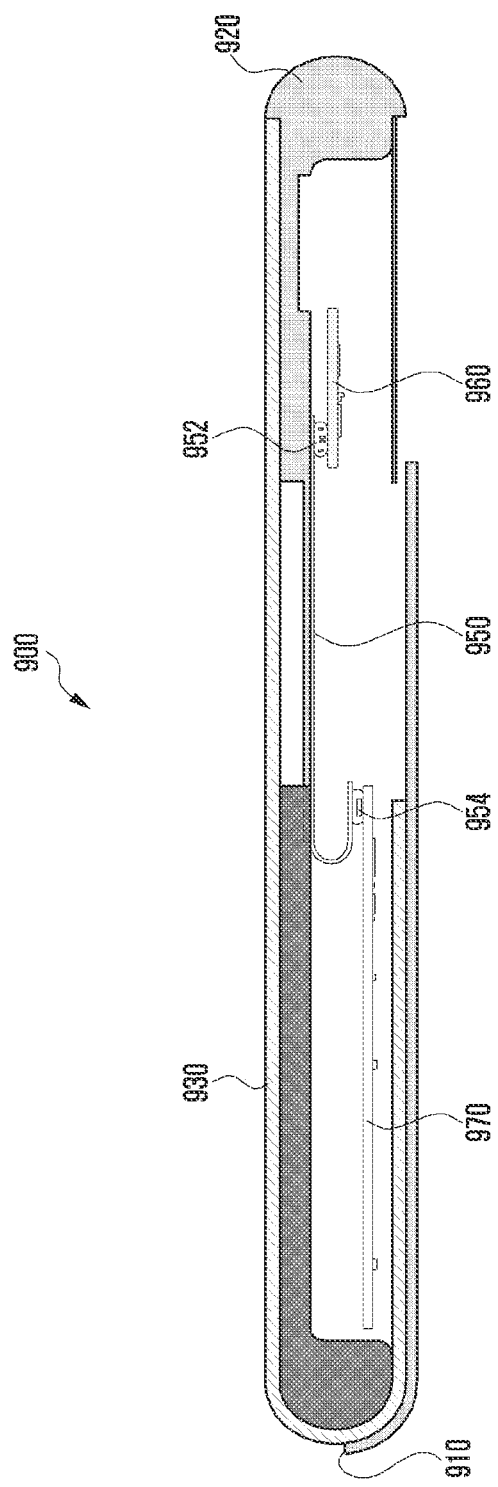
FIG. 9B is a diagram illustrating a side view of a position of a first FPCB of an electronic device in a slide-out state, according to an embodiment.

FIG. 9A is a diagram illustrating a side view of a position of a first FPCB of an electronic device in a slide-in state, according to an embodiment. FIG. 9B is a diagram illustrating a side view of a position of a first FPCB of an electronic device in a slide-out state, according to an embodiment.

FIGS. 9A and 9B are side views at a position in which a first FPCB 950 is disposed in an electronic device 900, that is, a position lower than the −y direction of FIG. 8 (e.g., along E-F of FIGS. 7A and 7B).

Referring to FIG. 9A, in the sliding-in state, a first housing 910 and a second housing 920 are in close contact with each other, and thus, at least a portion of a display 930 is received inside the first housing 910 through a rolling structure, and is not exposed to the outside. One side of the first FPCB 950 is fastened to a main PCB 970 through a first connector 954, and another side thereof is fastened to a second FPCB 960 through a second connector 952. The first FPCB 950 may be positioned in the first housing 910 in a bent shape while in the slide-in state.

Referring to FIG. 9B, since the first FPCB 950 is fastened to the second FPCB 960 through the second connector 952, the second connector 952 may be moved along with the movement of the second FPCB 960 fixed to the second housing 920 at the time of sliding-out, and thus, the fastening area of the second connector 952 in the first FPCB 950 may also be moved. Since the first FPCB 950 is fastened to the main PCB 970 through the first connector 954 and the main PCB 970 is fixed to the first housing 910 and does not move at the time of sliding-out, the fastening area of the first connector 954 in the first FPCB 950 may be fixed. Since the first FPCB 950 is made of a bendable material, only the area fastened to the second connector 952 may be moved at the time of sliding-out, so that the degree of bending may be changed and an electrical connection between the main PCB 970 and the second FPCB 960 can be maintained as is.

According to FIGS. 7A, 7B, 8, 9A and 9B, compared to the embodiments of FIGS. 5, 6A, and 6B, a separate FPCB for a connection between the camera module and the main PCB is not provided, and the camera module may be connected to the first FPCB and the second FPCB. As a separate FPCB for connecting the camera module and the main PCB is not provided, a corresponding space may be secured, the cost may be reduced, and stable power performance (e.g., power intensity (PI) or EMI) may be secured.

Figure 10:
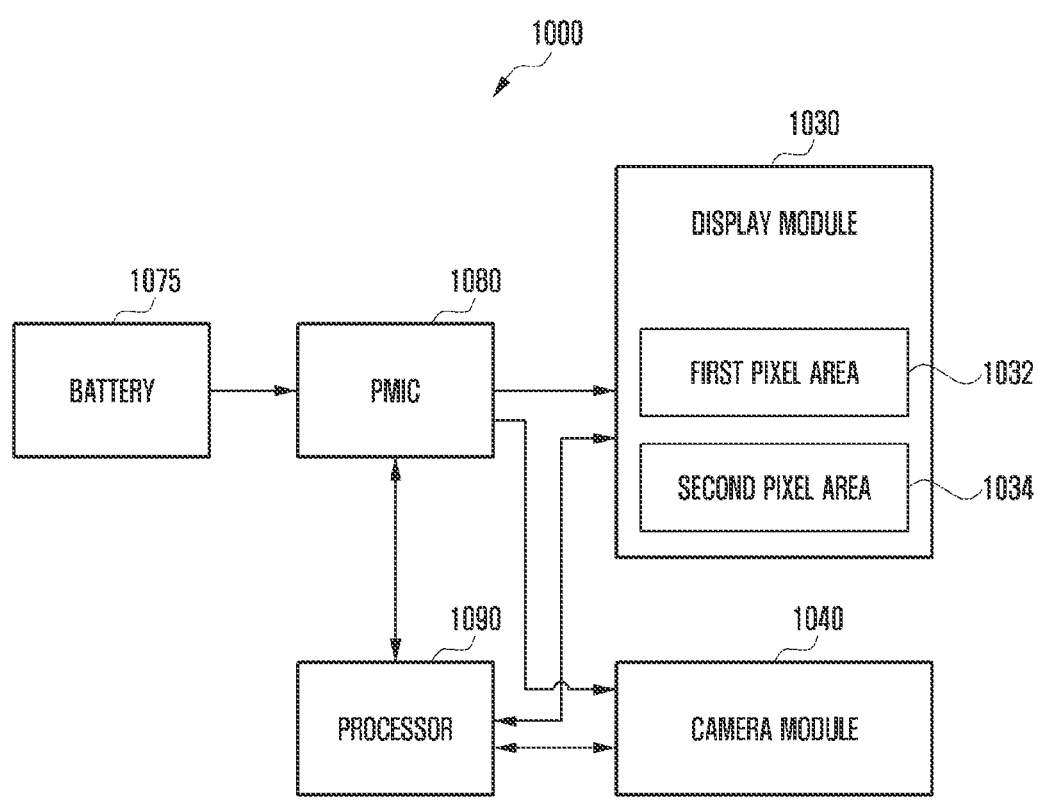
FIG. 10 is a block diagram illustrating an electronic device, according to an embodiment.

FIG. 10 is a block diagram illustrating an electronic device, according to an embodiment.

Referring to FIG. 10, an electronic device 1000 includes a display module 1030, a camera module 1040, a PMIC 1080, a battery 1075, and a processor 1090. One or more of the illustrated components may be omitted or substituted. The electronic device 1000 may further include at least some of the components and/or functions of the electronic device 101 of FIG. 1, and as described with reference to FIGS. 2A to 9B, and may have a form factor in which a portion of the flexible display is expanded or reduced using the sliding structure.

Hereinafter, a description of the structural features of the electronic device 1000 described above will be omitted, and an embodiment in which the electronic device 1000 turns on/off some pixel areas of a display module 1030 in synchronization with the operation of a camera module 1040 will be described.

The display module 1030 may include a display panel, a display driving circuit, a first FPCB, and a second FPCB. The first FPCB may be connected to the main PCB and the second FPCB by a connector, respectively, and the degree of bending during sliding-in and sliding-out of the electronic device 1000 may be changed so that at least a portion of the first FPCB may be moved.

The camera module 1040 may be connected to the second FPCB of the display module 1030 and may be electrically connected to the first FPCB and a processor 1090 of the main PCB through a signal line of the second FPCB.

The PMIC 1080 may be mounted on the second FPCB of the display module 1030. The PMIC 1080 may control power output from the battery 1075 to the camera module 1040 and/or the display module 1030.

The camera module 1040 may be disposed below a display panel. For example, as described with reference to FIG. 4A, the camera module 1040 may be disposed on an area partially removed from a support structure, which is an opaque material, and the display panel may not be removed from the corresponding area. Since a transparent cover and the display panel can transmit at least a portion of light, even if the transparent cover and the display panel are disposed on the top of the camera module 1040, light can be transmitted to the camera module 1040.

The display panel may include a plurality of pixels. Among the plurality of pixels of the display, pixels located at the top of the camera module 1040 and/or pixels located in a field of view of the camera module 1040 may be defined as a first pixel area 1032, and the remaining pixels may be defined as a second pixel area 1034. The pixel density ppi of the first pixel area 1032 may be lower than the pixel density of the second pixel area 1034.

The PMIC 1080 may cut off the power supplied to the first pixel area 1032 in synchronization with the driving of the camera module 1040. The pixel layer of the display panel is made of some transparent materials so that light can be transmitted through the display panel and the transparent cover on the top of the display panel to the image sensor of the camera module 1040. However, when light is output from the pixels in the first pixel area 1032 while the camera module 1040 is driven, light of the corresponding pixels may be recognized by the image sensor. Accordingly, the processor 1090 may control the PMIC 1080 to cut off the power supplied to the first pixel area 1032 at the timing when the camera module 1040 is being driven, so that the pixels of the first pixel area 1032 may be controlled not to output light while the camera module 1040 is being driven. In this case, the second pixel area 1034 may output image data independently of the first pixel area 1032.

The display module 1030 may include a plurality of data lines $D_1$ to $D_m$, where m is a natural number, and a plurality of gate lines $G_1$ to $G_n$, where n is a natural number. The plurality of data lines $D_1$ to $D_m$ and the plurality of gate lines $G_1$ to $G_n$ may cross each other. For example, the plurality of data lines $D_1$ to $D_m$ and the plurality of gate lines $G_1$ to $G_n$ may cross each other in a matrix form. A gate signal may be supplied to the plurality of gate lines, and a signal corresponding display data (e.g., RGB data), which is displayed in units of frames through the display panel according to the control of a display driving circuit (DDI) or DDIC, may be supplied to the plurality of data lines. For example, the signal corresponding to the display data (RGB data) may be supplied to a source driver under the control of a timing controller inside the DDI.

The PMIC 1080 may independently supply power to the gate line of the first pixel area 1032 and the gate line of the second pixel area 1034. For example, the PMIC 1080 may include a first control circuit for supplying power to some (e.g., $G_1$ to $G_k$) connected to the pixels of the first pixel area 1032 among the plurality of gate lines, and a second control circuit for supplying power to the remaining portions (e.g., $G_{k+1}$ to $G_n$) connected to the pixels of the second pixel area 1034 of the plurality of gate lines. The PMIC 1080 may cut off the power supplied to the gate lines of the pixels of the first pixel area 1032 through the first control circuit at the timing when the camera module 1040 is being driven, so that it is possible to control the pixels of the first pixel area 1032 not to output light while the camera module 1040 is being driven. In this case, the second pixel area 1034 may output image data independently of the first pixel area 1032 by receiving gate power by the second control circuit.

Accordingly, even when power supply to the first pixel area 1032 is cut off, power may be continuously supplied to the second pixel area 1034.

An electronic device includes a first housing, a second housing configured to be slidable from the first housing, and a main PCB disposed inside the first housing and including a processor mounted therein. The electronic device also includes a camera module disposed in the second housing, and a display module. The display module includes a display having a first region exposed externally and a second region within an internal space of the first housing, while in a slide-in state of the second housing. The display module also includes a first FPCB connected to the main PCB. At least a portion of the first FPCB is movable as the second housing slides out from the first housing. The camera module is electrically connected to the first FPCB to transmit and receive electrical signals to and from the processor mounted on the main PCB.

The display module may further include a display driving circuit disposed in the second housing and configured to drive the display. The display driving circuit may be electrically connected to the first FPCB to transmit and receive electrical signals to and from the processor mounted on the main PCB.

The electronic device may further include a second FPCB disposed inside the second housing and to be electrically connected to the first FPCB. The camera module and the display driving circuit are fastened to the second FPCB through a connector.

The electronic device may further include a battery. The first FPCB and the second FPCB include a power line for supplying power of the battery to the camera module and the display driving circuit.

A data signal output from the processor may be input to the display driving circuit through the connector and the second FPCB.

A PMIC for supplying power provided from the battery to the camera module and the display driving circuit may be mounted on the second FPCB.

The camera module may be disposed below the display. The display may include a first pixel area having pixels where the camera module is disposed below the display and a second pixel area excluding the first pixel area. The PMIC may be configured to cut off power supplied to the first pixel area in synchronization with driving of the camera module.

The PMIC may include a first control circuit for supplying gate power to the pixels of the first pixel area and a second control circuit for supplying gate power to pixels of the second pixel area, and may cut off the power supplied to the first pixel area through the first control circuit when the camera module is driven.

The camera module may be disposed on a front surface of the electronic device.

The camera module may be disposed below a partially removed area of the display.

The second FPCB may be fixed inside the second housing and is moved as the second housing slides out from the first housing.

The camera module and the display driving circuit may be fixed inside the second housing and are moved as the second housing slides out from the first housing.

The main PCB and the first FPCB may be fastened to each other through a connector, and when the second housing slides out from the first housing, the first region of the display connected to the main PCB through the connector in the first FPCB may not be moved.

The second region of the display may be deactivated in a slide-in state of the second housing.

An electronic device includes a first housing, a second housing configured to be slidable from the first housing, and a main PCB disposed inside the first housing and including a processor mounted thereon. The electronic device also includes a camera module disposed in the second housing, and a display including a first region exposed externally and a second region in an internal space of the first housing, while in a slide-in state of the second housing. The electronic device further includes a first FPCB configured to be connected to the main PCB. At least a portion of the first FPCB is movable as the second housing slides out from the first housing. The camera module is electrically connected to the first FPCB to transmit and receive electrical signals to and from the processor mounted on the main PCB.

The electronic device may further include a display driving circuit disposed in the second housing and configured to drive the display. The display driving circuit is electrically connected to the first FPCB to transmit and receive electrical signals to and from the processor mounted on the main PCB.

The electronic device may further include a second FPCB disposed inside the second housing and electrically connected to the first FPCB. The camera module and the display driving circuit are fastened to the second FPCB through a connector.

The electronic device may further include a battery. The first FPCB and the second FPCB include a power line for supplying power of the battery to the camera module and the display driving circuit.

A PMIC for supplying power provided from the battery to the camera module and the display driving circuit may be mounted on the second FPCB.

The camera module may be disposed below the display, the display may include a first pixel area having pixels where the camera module is disposed below the display and a second pixel area excluding the first pixel area, and the PMIC may be configured to cut off power supplied to the first pixel area in synchronization with driving of the camera module.

While the disclosure has been shown and described with reference to certain embodiments thereof, it will be understood by those skilled in the art that various changes in form and detail may be made therein without departing from the scope of the disclosure. Therefore, the scope of the disclosure should not be defined as being limited to the embodiments, but should be defined by the appended claims and equivalents thereof.

What is claimed is:

1. An electronic device comprising:
a first housing;
a second housing configured to be slidable from the first housing;
a main printed circuit board (PCB) disposed inside the first housing and comprising a processor mounted therein;
a camera module disposed in the second housing; and
a display module,
wherein the display module comprises:
a display having a first region exposed externally and a second region in an internal space of the first housing, while in a slide-in state of the second housing;
a first flexible PCB (FPCB) connected to the main PCB, wherein at least a portion of the first FPCB is movable as the second housing slides out from the first housing; and,
a second FPCB disposed inside the second housing and electrically connected to the first FPCB and the camera module,
wherein the camera module is electrically connected to the first FPCB via the second FPCB, and transmit and receive electrical signals to and from the processor mounted on the main PCB.

2. The electronic device of claim 1, wherein:
the display module further comprises a display driving circuit disposed in the second housing and configured to drive the display, and
the display driving circuit is electrically connected to the first FPCB to transmit and receive electrical signals to and from the processor mounted on the main PCB.

3. The electronic device of claim 2, wherein the camera module and the display driving circuit are fastened to the second FPCB through a connector.

4. The electronic device of claim 3, further comprising: a battery,
wherein the first FPCB and the second FPCB comprise a power line for supplying power of the battery to the camera module and the display driving circuit.

5. The electronic device of claim 4, wherein a data signal output from the processor is input to the display driving circuit through the connector and the second FPCB.

6. The electronic device of claim 4, wherein a power management integrated circuit (PMIC) for supplying power provided from the battery to the camera module and the display driving circuit is mounted on the second FPCB.

7. The electronic device of claim 6, wherein:
the camera module is disposed below the display;
the display comprises a first pixel area having pixels where the camera module is disposed below the display, and a second pixel area excluding the first pixel area; and
the PMIC is configured to cut off power supplied to the first pixel area in synchronization with driving of the camera module.

8. The electronic device of claim 7, wherein the PMIC comprises a first control circuit for supplying gate power to the pixels of the first pixel area and a second control circuit for supplying gate power to pixels of the second pixel area, and the PMIC cuts off the power supplied to the first pixel area through the first control circuit when the camera module is driven.

9. The electronic device of claim 1, wherein the camera module is disposed on a front surface of the electronic device.

10. The electronic device of claim 1, wherein the camera module is disposed below a partially removed area of the display.

11. The electronic device of claim 3, wherein the second FPCB is fixed inside the second housing and is moved as the second housing slides out from the first housing.

12. The electronic device of claim 11, wherein the camera module and the display driving circuit are fixed inside the second housing and are moved as the second housing slides out from the first housing.

13. The electronic device of claim 1, wherein:
the main PCB and the first FPCB are fastened to each other through a connector; and
when the second housing slides out from the first housing, the first region of the display connected to the main PCB through the connector in the first FPCB is not moved.

14. The electronic device of claim 1, wherein the second region of the display is deactivated in a slide-in state of the second housing.

15. An electronic device comprising:
a first housing;

a second housing configured to be slidable from the first housing;

a main printed circuit board (PCB) disposed inside the first housing and comprising a processor mounted thereon;

a camera module disposed in the second housing;

a display comprising a first region exposed externally and a second region in an internal space of the first housing, while in a slide-in state of the second housing;

a first flexible PCB (FPCB) configured to be connected to the main PCB, wherein at least a portion of the first FPCB is movable as the second housing slides out from the first housing, a second FPCB disposed inside the second housing and electrically connected to the first FPCB and the camera module, and wherein the camera module is electrically connected to the first FPCB via the second FPCB, and transmit and receive electrical signals to and from the processor mounted on the main PCB.

16. The electronic device of claim 15, further comprising:

a display driving circuit disposed in the second housing and configured to drive the display, wherein the display driving circuit is electrically connected to the first FPCB to transmit and receive electrical signals to and from the processor mounted on the main PCB.

17. The electronic device of claim 16, wherein the camera module and the display driving circuit are fastened to the second FPCB through a connector.

18. The electronic device of claim 17, further comprising:

a battery, wherein the first FPCB and the second FPCB comprise a power line for supplying power of the battery to the camera module and the display driving circuit.

19. The electronic device of claim 18, wherein a power management integrated circuit (PMIC) for supplying power provided from the battery to the camera module and the display driving circuit is mounted on the second FPCB.

20. The electronic device of claim 19, wherein:

the camera module is disposed below the display;

the display comprises a first pixel area having pixels where the camera module is disposed below the display and a second pixel area excluding the first pixel area; and the PMIC is configured to cut off power supplied to the first pixel area in synchronization with driving of the camera module.

* * * * *